United States Patent [19]

Jones

[11] Patent Number: 5,268,649
[45] Date of Patent: Dec. 7, 1993

[54] BIAS CIRCUIT FOR BIPOLAR TRANSISTORS

[75] Inventor: Martin E. Jones, Plano, Tex.
[73] Assignee: Texas Instruments Incorporated, Dallas, Tex.
[21] Appl. No.: 924,276
[22] Filed: Aug. 3, 1992
[51] Int. Cl.$^5$ .............................................. H03F 3/04
[52] U.S. Cl. ..................... 330/296; 330/298
[58] Field of Search ............... 330/183, 207 P, 296, 330/298

[56] References Cited

U.S. PATENT DOCUMENTS

| | | | |
|---|---|---|---|
| 3,374,442 | 3/1968 | Griffin | 330/296 |
| 3,501,710 | 3/1970 | Liepins et al. | 330/296 |
| 3,513,406 | 5/1970 | Leuthauser | 330/296 |
| 4,387,346 | 6/1983 | Fackler | 330/296 |
| 5,150,076 | 9/1992 | Asazawa | 330/296 |

FOREIGN PATENT DOCUMENTS

| | | | |
|---|---|---|---|
| 45243 | 4/1977 | Japan | 330/296 |
| 147813 | 11/1980 | Japan | 330/296 |
| 300703 | 12/1989 | Japan | 330/296 |

*Primary Examiner*—James B. Mullins
*Attorney, Agent, or Firm*—Michael K. Skrehot; James C. Kesterson; Richard L. Donaldson

[57] ABSTRACT

Generally, and in one form of the invention, a bias circuit for a transistor amplifier comprising a nonlinear element which limits current flow in a transistor, whereby the output-signal amplitude of the transistor is limited and the transistor is protected from exceeding a maximum current level, is disclosed. In another form of the invention, a bias circuit for a transistor amplifier comprising a nonlinear element 44 which limits current flow through a base terminal of a bipolar transistor 48, whereby the output-signal amplitude of the bipolar transistor 48 is limited and current flow through a collector or an emitter terminal of the transistor 48 is prevented from exceeding a maximum safe level, is disclosed. In still another form of the invention, an amplifier comprising an amplifying transistor 48 and a bias circuit, wherein the bias circuit comprises a nonlinear element 44 which limits current flow through a base terminal of a bipolar transistor 48, whereby the output-signal amplitude of the amplifier is limited and current flow through a collector or an emitter terminal of the amplifying transistor 48 is prevented from exceeding a maximum safe level, is disclosed. In yet another form of the invention, an oscillator circuit comprising an oscillator 92 and an amplifier 94, wherein the amplifier comprises an amplifying transistor and a bias circuit, and wherein the bias circuit comprises a nonlinear element which limits current flow through a base terminal of a bipolar transistor, whereby the output-signal amplitude of the amplifier is substantially constant despite a signal of varying amplitude from the oscillator, is disclosed.

30 Claims, 8 Drawing Sheets

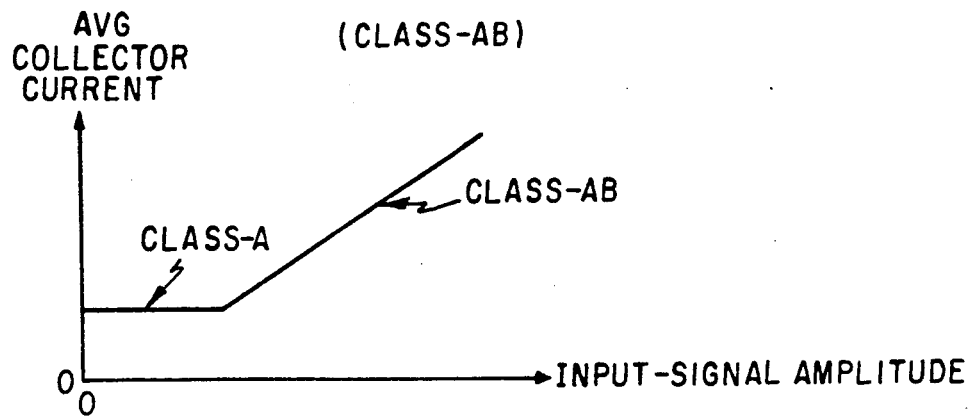
PRIOR ART  Fig. 2b
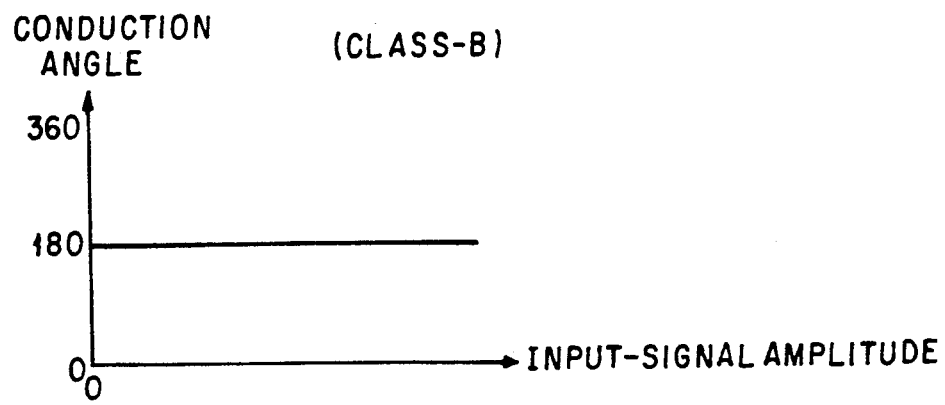
PRIOR ART  Fig. 3a
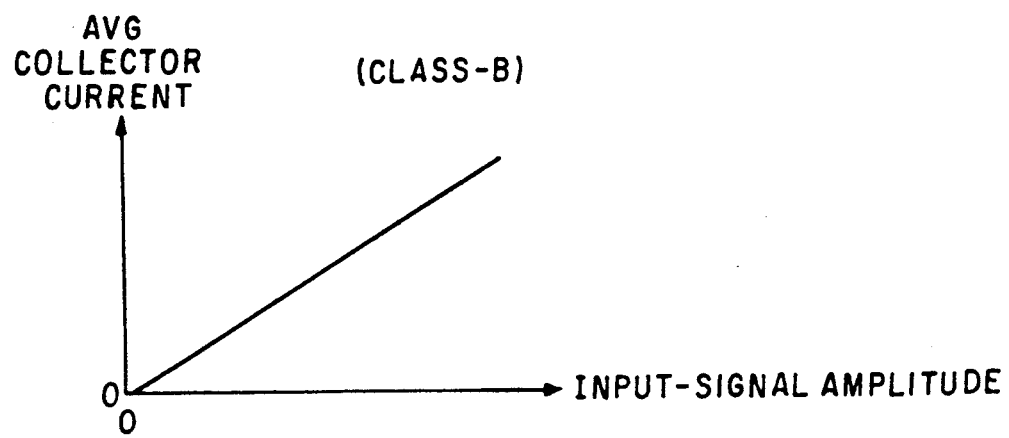
PRIOR ART  Fig. 3b

BIAS CIRCUIT FOR BIPOLAR TRANSISTORS

FIELD OF THE INVENTION

This invention generally relates to bias circuits for bipolar transistors.

BACKGROUND OF THE INVENTION

Without limiting the scope of the invention, its background is described in connection with npn bipolar transistors, as an example. The descriptions of current polarities herein would be reversed for pnp bipolar transistors.

A high-efficiency radio-frequency (RF) power amplifier design seeks to maximize the ratio of RF signal-power output to DC-power input. High-efficiency RF power amplifiers are often operated at conduction angles of 180 degrees or less (Class-B or Class-C). The conduction angle refers to the portion of one period of a sinusoidal input signal over which the transistor is "on", or conducting. A full period of the input signal contains 360 degrees.

If an amplifier transistor is biased such that it is conducting with no input signal, then for very small signals the conduction angle will be 360 degrees. Because the collector current symmetrically increases and decreases during successive half-cycles of the input signal, the average collector current remains constant. This is known as Class-A operation, with characteristics as illustrated in FIGS. 1a and 1b.

As the amplitude of the input signal is increased, a point is reached where the negative excursions of collector current are equal in magnitude to the no-signal collector current. Any further increase in input-signal amplitude forces the positive excursions (relative to the no-signal collector current) of current to become larger than the negative excursions (relative to the no-signal collector current). This is because the negative excursion of collector current for an npn transistor cannot be less than zero (sourced from ground). The average collector current is then higher than the no-signal collector current. This is known as Class-AB operation, with characteristics as illustrated in FIGS. 2a and 2b.

If the transistor is biased such that the no-signal collector current is nominally zero, but the transistor is on the verge of conducting, then one half-cycle of input signal will result in conduction and one half-cycle will not. The conduction angle is 180 degrees. This is known as Class-B operation, with characteristics as illustrated in FIGS. 3a and 3b. Average collector current will increase as input-signal amplitude increases.

If the transistor is biased such that the no-signal collector current is zero, and the current remains zero until the input-signal amplitude exceeds a finite threshold value, then the conduction angle is less than 180 degrees. This is known as Class-C operation, with characteristics as illustrated in FIGS. 4a and 4b. Average collector current is zero when the input-signal amplitude is below the threshold. Average collector current increases with increasing input-signal amplitude when the threshold is exceeded.

Of the operating modes discussed, Class-A operation generally results in the highest gain and lowest efficiency, while Class-C operation gives the lowest gain and highest efficiency. Class-AB and Class-B gain and efficiency characteristics are between these extremes.

Bipolar transistors contain no self-limiting mechanism for collector current. Instead, collector current generally continues to increase as input-signal levels increase until it reaches a maximum value determined by the ratio of available collector-supply voltage to collector-load impedance. Permanent device damage often occurs before any combination of external factors limits operating current. For example, the collector-emitter voltage at which avalanche breakdown occurs in some bipolar transistors decreases with increasing collector currents. If collector current increases (perhaps due to a lower-than-intended load impedance or higher-than-intended input-signal amplitude), then otherwise-safe collector-emitter voltages might lead to avalanche breakdown and transistor damage. When an amplifier circuit is designed using a bipolar transistor, one or more factors (such as input-signal level, collector-emitter voltage, or load impedance) may be controlled by design to restrict collector current to a safe level under normal operating conditions.

SUMMARY OF THE INVENTION

One prior art approach to enhance circuit survival has been to increase the size of the amplifier transistors. These designs have generally been thought of as fixes to reliability or survivability problems, rather than as overdesigned or overcompensated circuits. Overdesigning may increase size and/or cost of the overall circuit, adversely affecting the usefulness of a design. Larger transistors are capable of safely handling higher currents, but provide no protection against damage to other circuit elements from high amplifier output-signal levels. This problem may actually be worsened because the larger transistor is capable of supplying higher output-signal levels.

Another prior art approach is to enhance transistor survival by adding protection circuits which include sensing of unusual conditions with provision for shut-off. Circuits that monitor load impedance, collector voltage, or collector current are implemented to determine abnormal operating conditions and either correct the condition or block further operation of the circuit. This sensing is incorporated in the collector (output) circuit, and causes significant loss of either DC or RF signal power. The response time of the sensing circuit can limit the capability of this technique to provide satisfactory results during transient abnormal conditions.

Another prior art solution is to directly limit the available current for the collector or emitter terminal and thereby enhance transistor survival under the conditions of lower-than-normal load impedance, higher-than-normal collector-emitter voltage, and/or higher-than-normal input-signal level. However, this protection is accompanied by wasted DC power in the normal operating mode, due to voltage lost across the current-limiting circuit. The simultaneous demands of high efficiency and protection from catastrophic failure require a different approach than those described above. The inventive circuit described herein is intended to provide a solution to this problem.

Generally, and in one form of the invention, a bias circuit for a transistor amplifier comprising a nonlinear element which limits current flow in a transistor, whereby the output-signal amplitude of the transistor is limited and the transistor is protected from exceeding a maximum current level, is disclosed.

In another form of the invention, a bias circuit for a transistor amplifier comprising a nonlinear element which limits current flow through a base terminal of a bipolar transistor, whereby the output-signal amplitude of the bipolar transistor is limited and current flow through a collector or an emitter terminal of the transistor is prevented from exceeding a maximum safe level, is disclosed.

In still another form of the invention, an amplifier comprising an amplifying transistor and a bias circuit, wherein the bias circuit comprises a nonlinear element which limits current flow through a base terminal of a bipolar transistor, whereby the output-signal amplitude of the amplifier is limited and current flow through a collector or an emitter terminal of the amplifying transistor is prevented from exceeding a maximum safe level, is disclosed.

In yet another form of the invention, an oscillator circuit comprising an oscillator and an amplifier, wherein the amplifier comprises an amplifying transistor and a bias circuit, and wherein the bias circuit comprises a nonlinear element which limits current flow through a base terminal of a bipolar transistor, whereby the output-signal amplitude of the amplifier is substantially constant despite a signal of varying amplitude from the oscillator, is disclosed.

An advantage of the inventive circuit is that it indirectly limits collector or emitter current by limiting base current in a transistor. Because base current is smaller than collector or emitter current, and base and collector currents are proportional and related by a factor called Beta, wasted power due to voltage lost across the current-limiting circuit is less than in past solutions that relied on lossy elements in the collector or emitter bias circuits. Another advantage of the present circuit is that it occurs in the DC circuitry of the amplifier rather than in the RF signal path where losses associated with current limiting circuitry would adversely impact the power output of the amplifier. Additionally, the new technique does not rely on sensing, therefore response times are generally faster than in prior art solutions that use sensing. Another advantage of the invention is that the output-signal amplitude of the transistor is held substantially constant once the base-bias circuit begins to limit current. This power-levelling feature allows an amplifier to be used in situations where a variable-power signal is to be made relatively constant, such as on the output of an oscillator.

BRIEF DESCRIPTION OF THE DRAWINGS

In the drawings:

FIGS. 2a and 2b are plots of the operating characteristics of a Class-AB amplifier;

FIGS. 3a and 3b are plots of the operating characteristics of a Class-B amplifier;

Corresponding numerals and symbols in the different figures refer to corresponding parts unless otherwise indicated.

DETAILED DESCRIPTION OF PREFERRED EMBODIMENTS

Figure 1A:
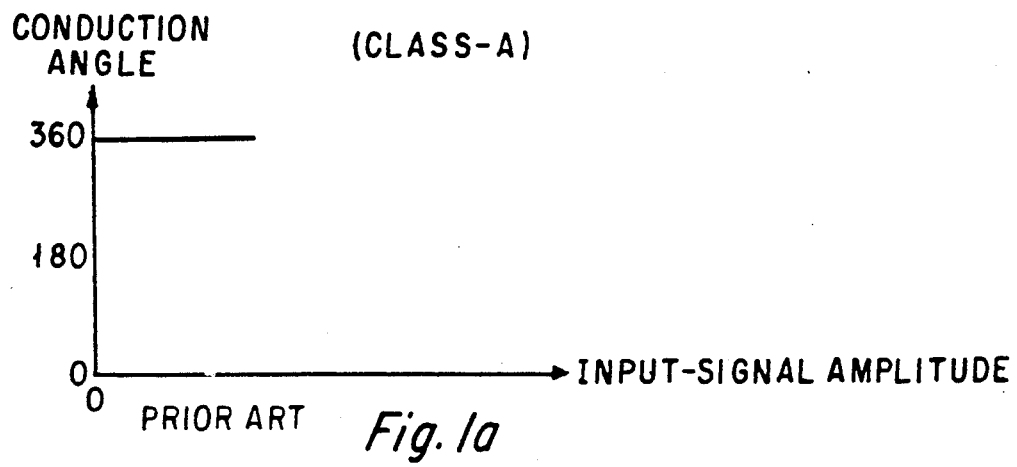
FIGS. 1a and 1b are plots of the operating characteristics of a Class-A amplifier.
Figure 1B:
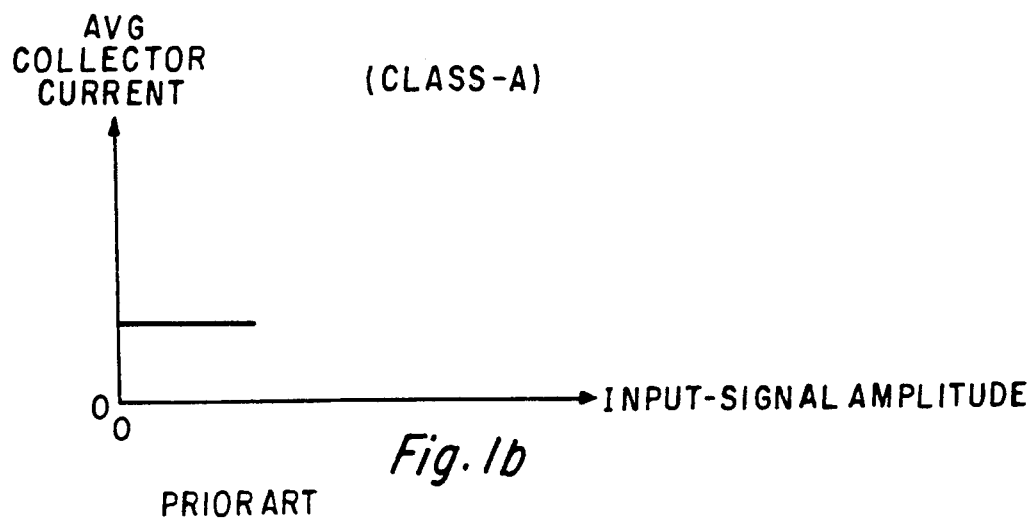
Figure 2A:
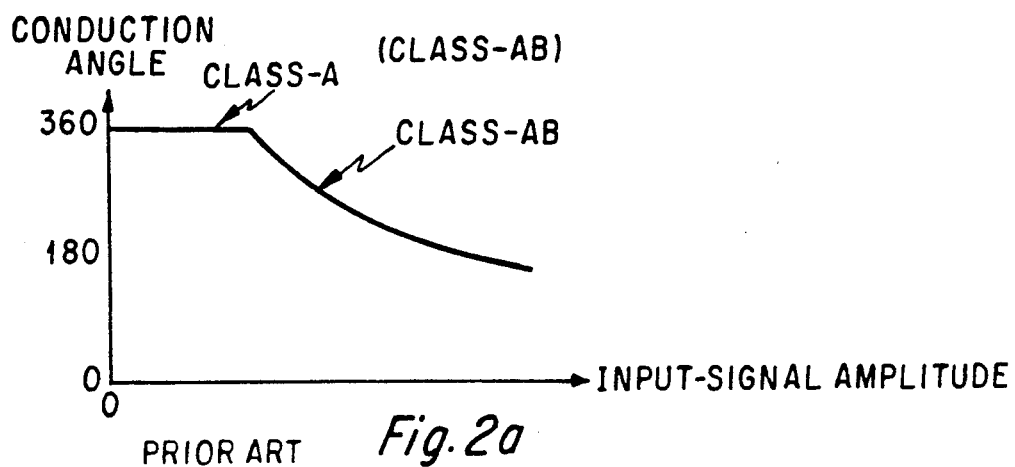
Figure 4A:
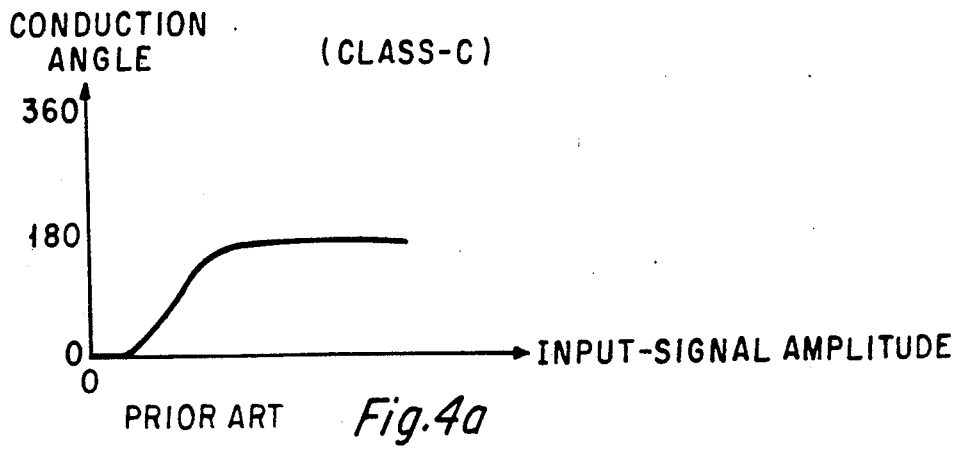
FIGS. 4a and 4b are plots of the operating characteristics of a Class-C amplifier.
Figure 4B:
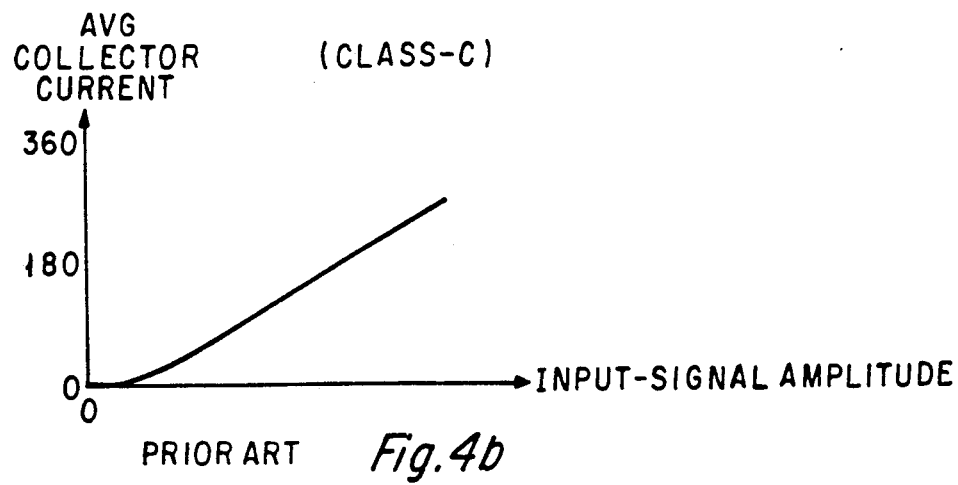
Figure 5:
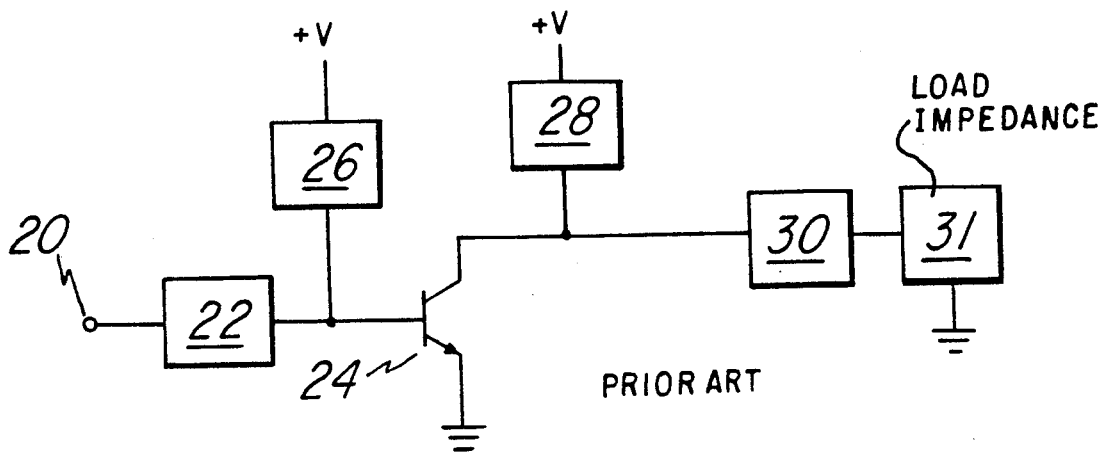
FIG. 5 is a diagram of a typical amplifier.

FIG. 5 is a functional block diagram of a typical prior art bipolar amplifier circuit. The input signal is applied at a terminal 20. An impedance-matching circuit 22 couples the input signal into the amplifying transistor 24. The base-bias circuit 26 supplies current to the base of the transistor 24. The base bias circuit 26 may occur before or after the input matching circuit 22, relative to the transistor 24, or their functions may be combined. The collector-bias circuit 28 and output-impedance matching circuit 30, may also occur in reverse order, or be combined. The load impedance 31 is typically the characteristic impedance of the transmission line or antenna into which the output signal of the amplifier is directed. In subsequent Figures in this description only the base bias circuitry, such as 26 and the high-frequency transistor, such as 24, are shown.

High-efficiency power amplifiers are typically operated Class-B or Class-C, with conduction angles of 180 degrees or less. In order to control conduction angle over the expected range of signal amplitudes, the base-bias circuit 26 is designed to have a specified non-zero DC impedance, and bias the transistor 24 near class B with zero input-signal amplitude. The non-zero bias-source impedance introduces a signal-dependent voltage drop which causes the base-emitter voltage to decrease as signal amplitude increases. This is because increasing signal amplitude results in increasing collector, and therefore base, currents. The decreased base-emitter voltage results in decreased conduction angle. At the higher signal amplitudes, this decrease in conduction angle results in higher-efficiency amplifier operation.

Selection of the correct DC impedance for the base-bias network involves tradeoffs between gain and efficiency over the entire range of expected input-signal amplitudes. If the impedance is too low, the amplifier operation remains too near Class-B, and efficiency is not optimized. If the impedance is too high, the conduction angle at the higher signal amplitudes is too low. This results in an excessive decrease in amplifier gain, which may sometimes be overcome by increasing the zero-signal base-emitter voltage. However, this results in higher collector currents and reduced efficiency at the lower signal amplitudes.

Figure 6A:
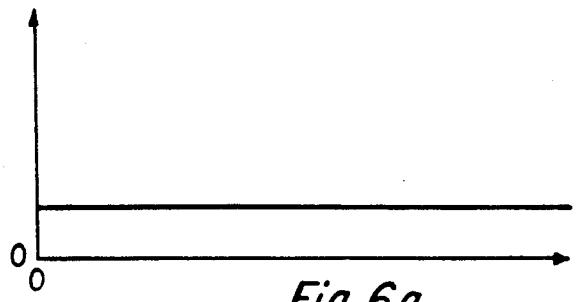
FIGS. 6a–6d are plots of the operating characteristics of an amplifier with no protection circuitry.
Figure 6B:
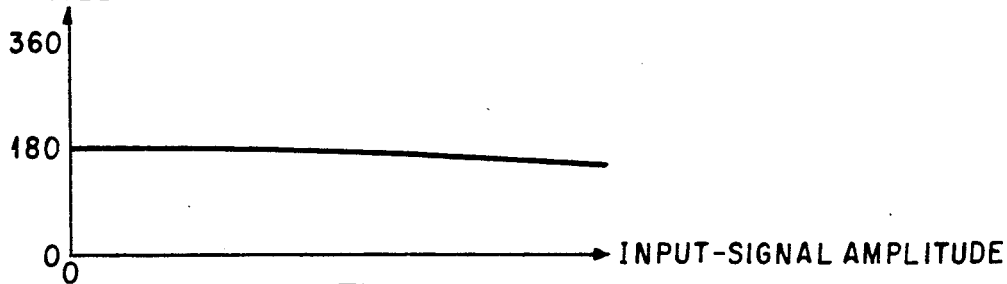
Figure 6C:
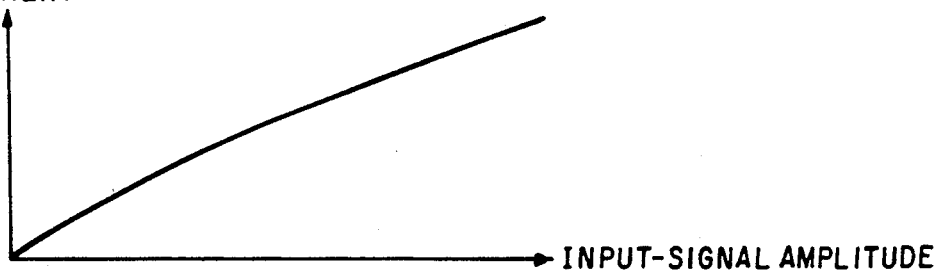
Figure 6D:
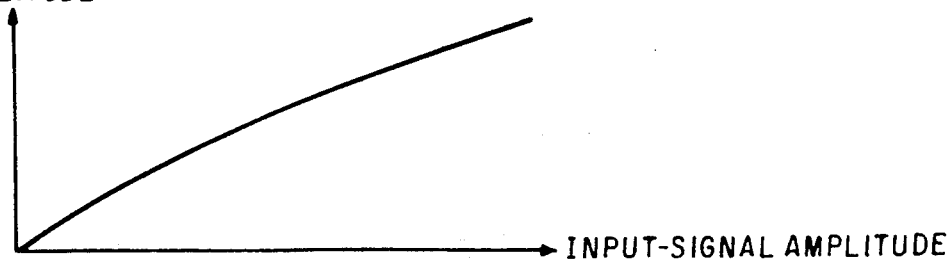

FIGS. 6a–6d illustrate the behavior of a typical prior-art high-efficiency amplifier having no protection circuitry, and using a base-bias circuit with fixed DC-output impedance. The DC impedance of the bias network is constant (FIG. 6a). As input-signal amplitude increases, increasing base current causes a decreasing base-emitter voltage, which results in decreasing conduction angle (FIG. 6b). Because this conduction-angle decrease must be relatively small in order to preserve amplifier gain, average collector current still increases substantially with increasing signal level (FIG. 6c). Output-signal amplitude also continues to increase with increasing input-signal amplitude (FIG. 6d). Maximum achievable values of the collector current and of the output-signal amplitude are largely limited by external factors such as load impedance and collector-emitter voltage.

Figure 7:
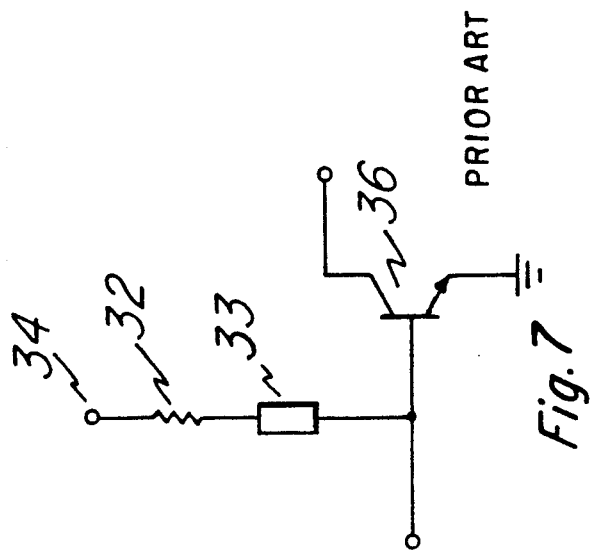
FIG. 7 is a schematic diagram of a prior art amplifier.

A typical prior-art base-bias circuit is illustrated in FIG. 7. Bias choke 33, shown as a block in FIG. 7, is typically comprised of inductive and capacitive elements. Its purpose is to isolate signal circuitry from bias circuitry. One common implementation of this choke is a single inductor, and another is a resonant inductive and capacitive parallel network. The remaining bias circuitry exhibits an equivalent series resistance represented by resistor 32. A reference voltage is applied at node 34. This voltage, which is equal to the base-emitter voltage of the amplifier transistor 36 when base current is equal to zero, is adjusted to provide approximately Class-B operation for small signals. As the input-signal amplitude increases, the base-emitter voltage of the amplifier transistor decreases and conduction angle decreases. The amplifier operation becomes Class-C as input-signal amplitude is increased.

Figure 8:
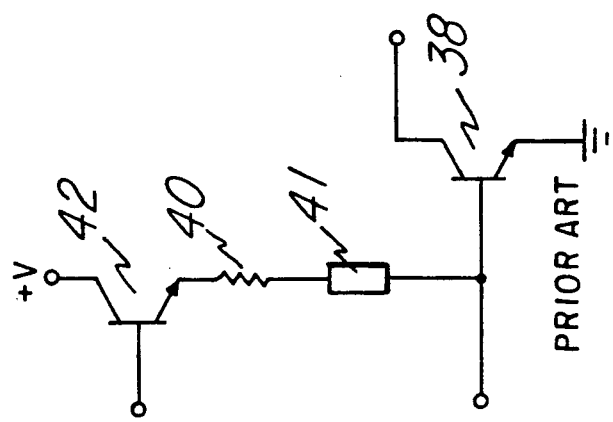
FIG. 8 is a schematic diagram of a prior art amplifier.

Another typical prior-art circuit is shown in FIG. 8. The base-bias circuit consists of a transistor 42 in common-collector configuration, having a resistance 40 and choke 41 in series with the emitter terminal. This resistance 40 is an element representing the equivalent resistance of the bias circuit. Reactive elements such as inductors and capacitors, commonly occurring in bias circuitry, are not shown. Resistance 40 is connected to the base terminal of the amplifier transistor 38. Again, the reference voltage and resistance are typically adjusted to provide operation which moves from Class-B to Class-C as input-signal amplitude increases. The embodiments illustrated in FIGS. 7 and 8 provide similar performance. The common-collector transistor 42 serves to eliminate the requirement that the base current of amplifier-transistor 38 be supplied entirely from the reference voltage. The output impedances of the circuits in FIGS. 7 and 8 are relatively constant with input-signal level, and do not provide limiting or protection. Given sufficient variation in external parameters (collector voltage, load impedance, and input-signal amplitude), the collector current or the output-signal amplitude may increase to destructive levels.

Figure 9:
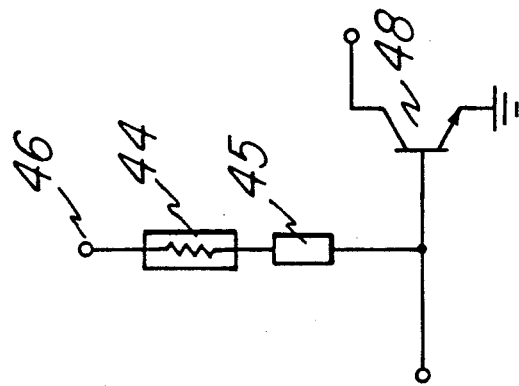
FIG. 9 is a schematic diagram of an amplifier using the first preferred embodiment of the invention.
Figure 10:
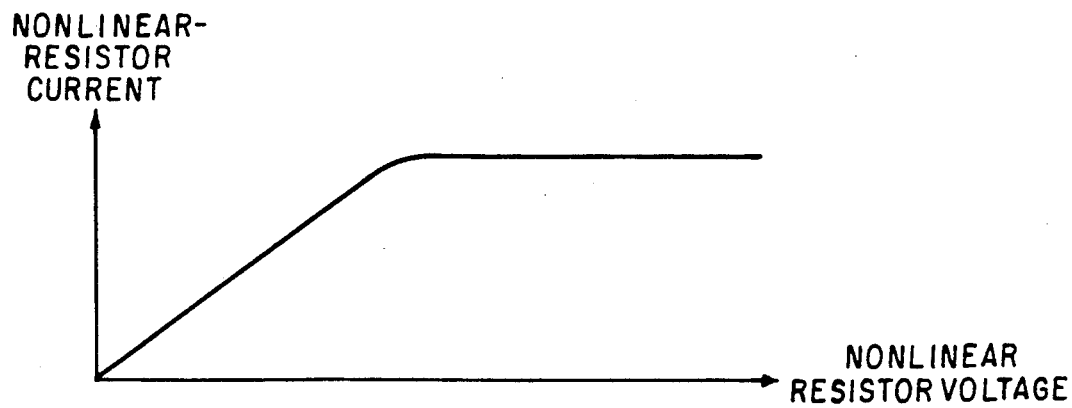
FIG. 10 is a plot of the current-voltage characteristics of a nonlinear resistor.

A first preferred embodiment of the inventive circuit is shown in FIG. 9. Similar to the prior art circuit of FIG. 7, this circuit uses a series resistor 44 and choke 45 to connect a reference voltage 46 to the power-amplifier transistor 48. The circuits of FIGS. 7 and 9 differ in the implementation of the series resistances. While resistance 32 exhibits conventional linear behavior, resistor 44 is fabricated using a semiconductor material with nonlinear properties. For example, Si-doped GaAs may be used to fabricate integrated-circuit resistors. The current/voltage characteristics of such a resistor will be similar to those shown in FIG. 10. The current increases linearly with applied voltage until the applied voltage reaches a threshold known as the saturation voltage. The current then ceases to increase substantially further with increasing voltage, effectively providing a current-limiting function. By controlling the physical parameters of the semiconductor resistor, linear resistance and limit currents may be independently designed. This will allow the amplifier's normal operation and current-limited parameters to be simultaneously optimized.

One method of fabricating a nonlinear resistor is to uniformly implant a GaAs wafer with Si. The wafer is then annealed to repair implant damage. AuGeNi contacts are evaporated at the area of the wafer chosen to be the resistor and then the contacts are alloyed to create ohmic contacts. A selective implant using B is then performed on adjacent areas to isolate the resistor. This makes the GaAs between resistors and other components insulating.

The resistance of the structure is determined by the resistance of the GaAs and the resistance of the contacts to the GaAs. The sheet resistance of the implanted GaAs, as well as the dimensions of the resistor determine its resistance. A typical value of sheet resistance is 350 ohms/square, while the contact resistance is typically 6 ohms/mil of width. The saturation characteristics of the resistor are determined by the electric field across it. When the electric field in the resistor exceeds approximately 8.4 volts/mil of length, the current does not substantially increase with applied voltage.

FIGS. 11a–11d illustrate the behavior of a high-efficiency amplifier using this invention, a base-biase circuit with current limiting. The DC impedance (FIG. 11a) remains low until the amplifier-transistor base current reaches the preset limit value. DC impedance then increases to a much higher value, causing a rapid decrease in base-emitter voltage and conduction angle (FIG. 11b) whenever input-signal level increases beyond that which corresponds to the preset base-current limit. The collector current (FIG. 11c) is limited because of its proportionality to the limited base current. Output-signal amplitude (FIG. 11d) is constant, or increases at a much slower rate with respect to input-signal amplitude.

Figure 12:
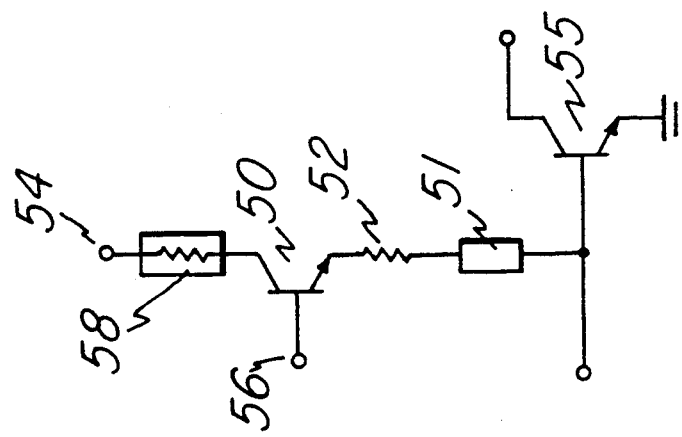
FIG. 12 is a schematic diagram of a second preferred embodiment of the invention.

In order to provide current-limited base bias and also eliminate the need for the reference voltage to supply all of the amplifier transistor's base current, a second preferred embodiment (FIG. 12) may be used. This circuit consists of a transistor 50 in common-collector configuration, having a resistor 52 in series with the emitter terminal. Resistor 52 and choke 51 are serially connected to the base terminal of the amplifier transistor 55. A reference voltage 56 is applied to the base terminal of the common-collector transistor 50. Again, the reference voltage 56 and emitter resistor 52 are typically adjusted to provide operation which moves from Class-B to Class-C as input-signal amplitude increases. The collector of the common-collector transistor is connected to a positive supply 54 by a nonlinear (saturating) semiconductor resistor 58. When the amplifier transistor's base current is less than the limiting level, this circuit functions similarly to the prior-art circuit of FIG. 8. However, when the base current exceeds the saturation current of the nonlinear semiconductor resistor 58, the base current is limited with all the accompanying advantages described in relation to the first preferred embodiment.

In situations where a nonlinear resistor is impractical or undesirable to implement, functionally equivalent circuitry may be substituted. A third and fourth embodiment of the inventive concept illustrate this point.

Figure 13:
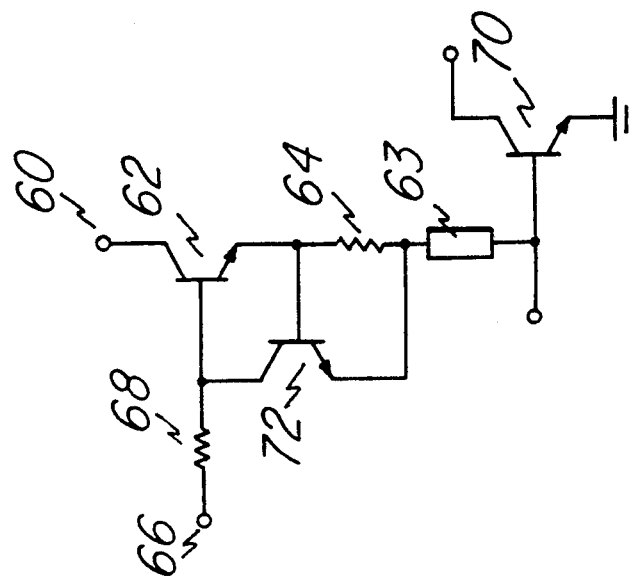
FIG. 13 is a schematic diagram of a third preferred embodiment of the invention.

In a third preferred embodiment (FIG. 13), the amplifier transistor's base-bias current flows from a positive supply 60 through a transistor in common-collector configuration 62 and through a resistor 64 and choke 63. A reference voltage 66 is applied to the transistor 62 through a resistor 68. The voltage developed by the amplifier transistor's 70 base current flowing through resistor 64 is applied to the base-emitter junction of another transistor 72. Collector current for transistor 72 is supplied by the same resistor 68 as the base current for transistor 62. As the input-signal amplitude to amplifier transistor 70 increases, the voltage developed across resistor 64 by the increasing base current of amplifier-transistor 70 causes transistor 72 to conduct. The collector current drawn by transistor 72 from resistor 68 reduces the current available for the base of transistor 62. Transistor 62 begins to turn off, preventing further substantial increase in the base current of amplifier transistor 70.

Figure 14:
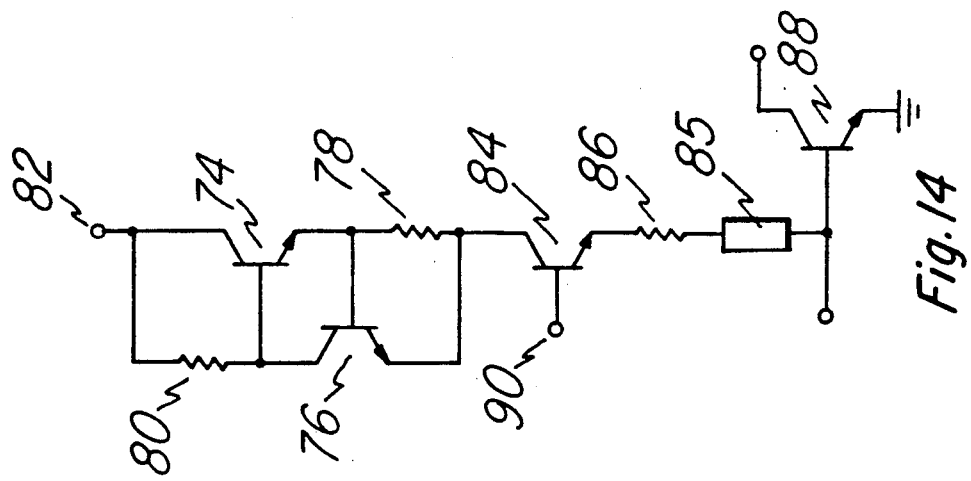
FIG. 14 is a schematic diagram of a fourth preferred embodiment of the invention.

A fourth preferred embodiment (FIG. 14) is similar to the second preferred embodiment (FIG. 12), but the nonlinear resistor 58 is replaced by a current-limited voltage source constructed of two transistors, 74 and 76, and two resistors, 78 and 80. Base bias for common-collector transistor 74 is furnished from the positive supply 82 by resistor 80. Transistor 74 is normally conducting. Collector-emitter current of transistor 74, which is the output current from the current-limited voltage source, flows through resistor 78. The voltage developed across resistor 78 is applied to the base-emitter junction of transistor 76, which is normally off (not conducting). When the output current reaches the desired limiting value (determined by resistor 78), the base-emitter voltage of transistor 76 is large enough to cause transistor 76 to conduct. The collector of transistor 76 is supplied by the same resistor 80 as the base of transistor 74. When transistor 76 begins to conduct, base bias for transistor 74 is reduced. Transistor 74 begins to turn off, preventing further increase in the output current.

Output current from the current-limited voltage source flows through transistor 84, resistor 86, and choke 85 to the base terminal of amplifier-transistor 88. A reference voltage 90 is applied to the base terminal of transistor 84. Similar to the second embodiment of FIG. 12, the reference voltage 90 and resistor 86 are selected to provide the desired Class-B/Class-C operation over the desired range of input-signal amplitudes. The current-limit value may be controlled by selection of resistor 78.

Figure 11A:
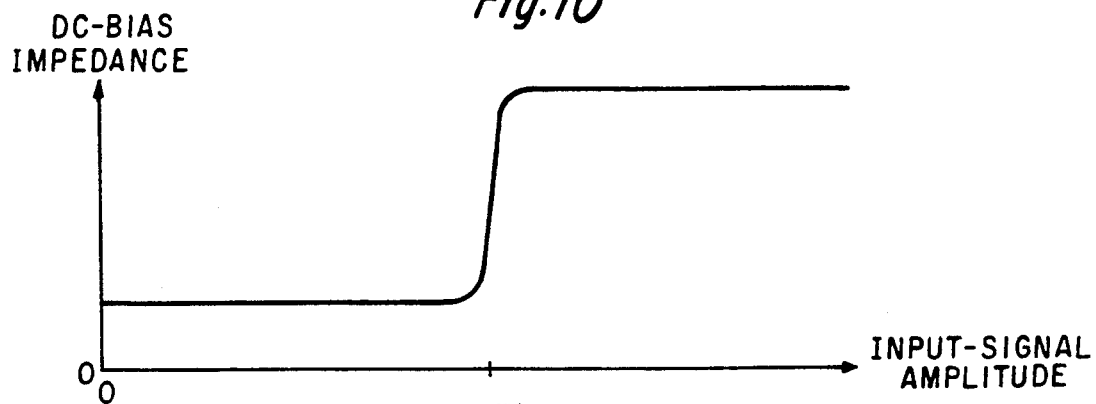
FIGS. 11a–11d are plots of the operating characteristics of the first preferred embodiment of the invention.
Figure 11B:
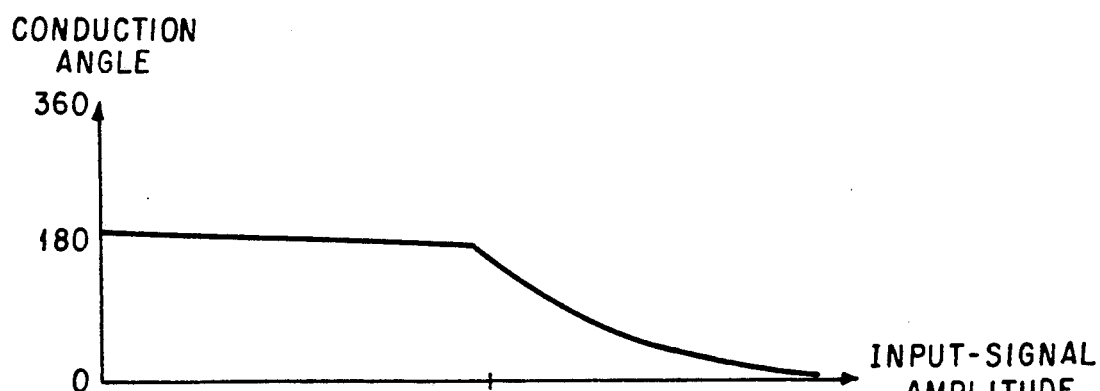
Figure 11C:
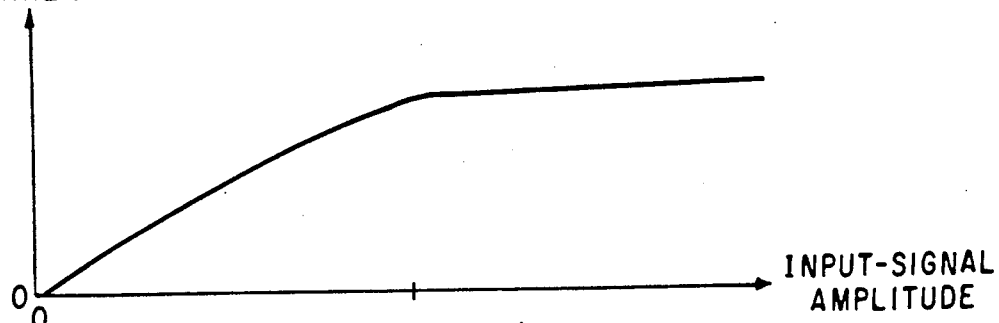
Figure 11D:
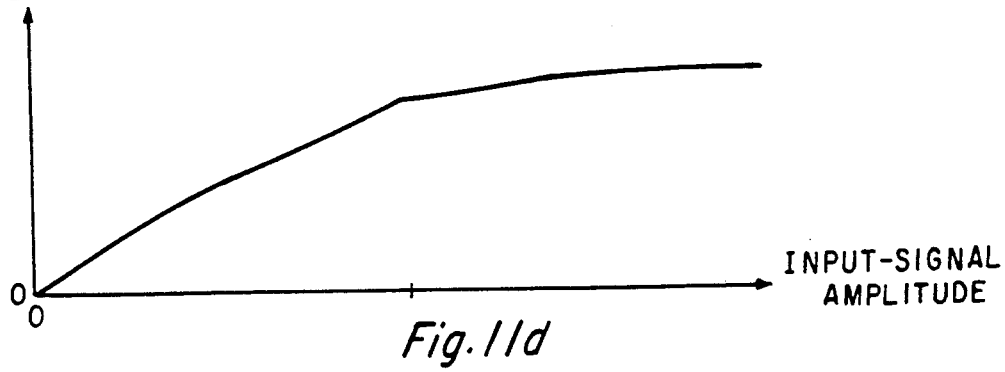

In addition to preventing transistor damage, the inventive circuits described in the first, second, third, and fourth embodiments hold output-signal amplitude substantially constant once the base-bias circuit begins to limit current (as illustrated in FIG. 11d). The source impedance of the current-limited base-bias circuit increases as the limit current is reached. Because base current is proportional to collector current, and collector current increases as signal amplitude increases, the output impedance of the base-bias circuit increases with increasing signal amplitude. For a given base current, a higher bias-source impedance results in a lower base-emitter voltage. This reduces the conduction angle of the transistor. Lower conduction angles result in lower amplifier gain, which offsets the increased input-signal amplitude and holds the output-signal amplitude substantially constant.

Figure 15:
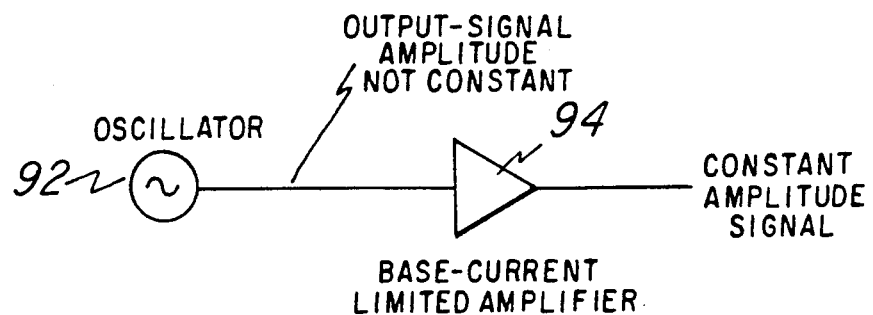
FIG. 15 is a schematic diagram of a fifth preferred embodiment of the invention.

A fifth preferred embodiment, shown in FIG. 15, takes advantage of the output-signal amplitude levelling characteristics of the bias circuit by cascading the base-current limited amplifier 94 of the first, second, third, or fourth embodiment with the output of an oscillator 92. Provided the oscillator's output signal exceeds the input-signal amplitude required to cause base-current limiting in the amplifier 94 (determined by the bias circuit), the amplifier's output-signal amplitude remains approximately constant at the level where base-current limiting in the amplifier 94 takes effect.

A few preferred embodiments have been described in detail hereinabove. It is to be understood that the scope of the invention also comprehends embodiments different from those described, yet within the scope of the claims.

Internal and external connections can be ohmic, capacitive, inductive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bias circuit for supplying a range of operating bias currents to a first transistor, said bias circuit comprising a nonlinear resistor having a saturation current greater than said range of operating bias currents and equal to a desired maximum bias current.

2. The bias circuit of claim 1 wherein said saturation current is established by imposing an electric field of approximately 8.4 volts per mil of length on said nonlinear resistor.

3. The bias circuit of claim 1 wherein said nonlinear resistor is comprised of GaAs.

4. The bias circuit of claim 1 wherein said nonlinear resistor has a sheet resistance of approximately 350 ohms/square.

5. The bias circuit of claim 1 further comprising a choke interposed between said nonlinear resistor and said first transistor wherein a signal from said first transistor is blocked from reaching said nonlinear resistor by said choke.

6. The bias circuit of claim 1 further comprising a second transistor having a collector terminal coupled to said nonlinear resistor, an emitter terminal coupled to said first transistor through a linear resistor, and a base terminal, wherein said range of operating bias currents is set by applying an appropriate voltage to said base terminal and wherein an upper portion of said range of operating bias currents is limited by said saturation current of said nonlinear resistor.

7. The bias circuit of claim 6 further comprising a choke in series with said linear resistor and interposed between said emitter terminal and said first transistor wherein a signal from said first transistor is blocked from reaching said nonlinear resistor by said choke.

8. A bias circuit for an amplifying transistor having an input base terminal, wherein said bias circuit is connected to said input base terminal and comprises:
 a first transistor having a first emitter terminal, a first base terminal, and a first collector terminal;
 a first resistor connected to said first emitter terminal and said input base terminal; and a second transistor having a second emitter terminal, a second base terminal, and a second collector terminal, wherein said second base terminal is connected between said first emitter terminal and said first resistor, said second collector terminal is connected to said first base terminal, and said second emitter terminal is coupled to said input base terminal.

9. The bias circuit of claim 8 fabricated as an integrated circuit with said amplifying transistor.

10. The bias circuit of claim 8 further comprising a choke interposed between said first resistor and said input base terminal wherein a signal on said input base terminal is blocked from reaching said first resistor by said choke.

11. The bias circuit of claim 8 further comprising a second resistor connected between said first base terminal and said second collector terminal, a reference voltage connected to said second resistor, and a power supply connected to said first collector terminal whereby a signal on said input base terminal reaching a level such that a current in said first resistor produces a voltage between said second base and said second emitter terminals that turns on said second transistor thereby increasing a current in said second resistor and increasing a voltage drop between said reference voltage and said first base terminal such that a current in said first transistor is prevented from increasing substantially, wherein a current available to said input base terminal from said supply is limited.

12. The bias circuit of claim 11 fabricated as an integrated circuit with said amplifying transistor.

13. The bias circuit of claim 8 further comprising a third transistor and a second resistor connected in series with said first transistor and said first resistor, wherein current flow thorough the series connected first transistor, first resistor, third transistor, and second resistor may be controlled by applying an appropriate voltage to a base terminal of said third transistor.

14. The bias circuit of claim 13 fabricated as an integrated circuit with said amplifying transistor.

15. The bias circuit of claim 13 further comprising a third resistor connected to said first base terminal and said second collector terminal, a power supply connected to said third resistor and said first collector terminal whereby a signal on said input base terminal reaching a level such that a current in said first resistor produces a voltage between said second base and said second emitter terminals that turns on said second transistor thereby increasing a current in said third resistor and increasing a voltage drop between said power supply and said first base terminal such that a current in said first transistor is prevented from increasing substantially, wherein a current available to said input base terminal from said power supply is limited.

16. The bias circuit of claim 15 fabricated as an integrated circuit with said amplifying transistor.

17. An integrated circuit amplifier comprising:
a first transistor having a range of operating bias currents; and
a bias circuit connected between an input terminal of said first transistor and a power supply, said bias circuit comprising a nonlinear resistor having a saturation current greater than said range of operating bias currents and equal to a desired maximum bias current.

18. The integrated circuit of claim 17 wherein said saturation current is established by imposing an electric field of approximately 8.4 volts per mil of length on said nonlinear resistor.

19. The integrated circuit of claim 17 wherein said nonlinear resistor is comprised of GaAs.

20. The integrated circuit of claim 17 further comprising a choke interposed between said nonlinear resistor and said input terminal wherein a signal on said input terminal is blocked from reaching said nonlinear resistor by said choke.

21. The integrate circuit of claim 17 further comprising a second transistor having a collector terminal coupled to said nonlinear resistor, an emitter terminal coupled to said input terminal through a linear resistor, and a base terminal, wherein said range of operating bias currents is set by applying an appropriate voltage to said base terminal and wherein an upper portion of said range of operating bias currents is limited by said saturation current of said nonlinear resistor.

22. The integrate circuit of claim 21 further comprising a choke in series with said linear resistor and interposed between said emitter terminal and said input terminal wherein a signal on said input terminal is blocked from reaching said nonlinear resistor by said choke.

23. A oscillator circuit comprising an amplifier cascaded with an output terminal of an oscillator, wherein said amplifier comprises:
a first transistor having a range of operating bias currents; and
a bias circuit connected between an input terminal of said first transistor and a power supply, said bias circuit comprising a nonlinear resistor having a saturation current greater than said range of operating bias currents and equal to a desired maximum bias current.

24. The oscillator circuit of claim 23 wherein said saturation current is established by imposing an electric field of approximately 8.4 volts per mil of length on said nonlinear resistor.

25. The oscillator circuit of claim 23 wherein said nonlinear resistor is comprised of GaAs.

26. The oscillator circuit of claim 23 further comprising a choke interposed between said nonlinear resistor and said input terminal wherein a signal on said input terminal is blocked from reaching said nonlinear resistor by said choke.

27. The oscillator circuit of claim 23 further comprising a second transistor having a collector terminal coupled to said nonlinear resistor, an emitter terminal coupled to said input terminal through a linear resistor, and a base terminal, wherein said range of operating bias currents is set by applying an appropriate voltage to said base terminal and wherein an upper portion of said range of operating bias currents is limited by said saturation current of said nonlinear resistor.

28. The oscillator circuit of claim 27 further comprising a choke in series with said linear resistor and interposed between said emitter terminal and said input terminal wherein a signal on said input terminal is blocked from reaching said nonlinear resistor by said choke.

29. The oscillator circuit of claim 23 wherein a signal from said output of said oscillator turns on said first transistor and induces said saturation current in said nonlinear resistor, thereby limiting and making stable an output signal of said amplifier.

30. The oscillator circuit of claim 23 fabricated as an integrated circuit.

* * * * *